United States Patent
Gu

(10) Patent No.: US 8,547,261 B2
(45) Date of Patent: Oct. 1, 2013

(54) CALIBRATION DEVICE FOR MOBILE TERMINAL AND ADC MODULE THEREOF

(75) Inventor: Jianliang Gu, Huizhou (CN)

(73) Assignee: Huizhou TCL Mobile Communication Co., Ltd., Huizhou, Guangdong (CN)

( * ) Notice: Subject to any disclaimer, the term of this patent is extended or adjusted under 35 U.S.C. 154(b) by 6 days.

(21) Appl. No.: 13/505,542

(22) PCT Filed: May 18, 2011

(86) PCT No.: PCT/CN2011/074211
§ 371 (c)(1),
(2), (4) Date: May 2, 2012

(87) PCT Pub. No.: WO2012/022175
PCT Pub. Date: Feb. 23, 2012

(65) Prior Publication Data
US 2012/0223848 A1    Sep. 6, 2012

(30) Foreign Application Priority Data
Aug. 17, 2010    (CN) .......................... 2010 1 02561750

(51) Int. Cl.
*H03M 1/10* (2006.01)
(52) U.S. Cl.
USPC ........... 341/129; 341/155; 341/125; 341/130; 341/150; 455/126; 327/539; 327/552
(58) Field of Classification Search
USPC .......... 341/120–155; 327/539, 552; 455/126
See application file for complete search history.

(56) References Cited

U.S. PATENT DOCUMENTS

| | | | | |
|---|---|---|---|---|
| 5,760,720 A * | 6/1998 | Nolan et al. | .................. | 341/120 |
| 7,439,608 B2 * | 10/2008 | Arendt | .......................... | 257/592 |
| 7,558,539 B2 * | 7/2009 | Huynh et al. | ................. | 455/126 |
| 7,710,303 B2 * | 5/2010 | Wojewoda et al. | ........... | 341/155 |
| 7,889,104 B2 * | 2/2011 | Wang et al. | ................... | 341/120 |
| 8,130,422 B2 * | 3/2012 | Tsai | ............................... | 341/120 |
| 8,248,280 B2 * | 8/2012 | Zhan et al. | .................... | 341/120 |

FOREIGN PATENT DOCUMENTS

| | | |
|---|---|---|
| CN | 101145780 A | 3/2008 |
| CN | 101393466 A | 3/2009 |
| CN | 101764610 A | 6/2010 |
| CN | 101931409 A | 12/2010 |
| CN | 201813361 U | 4/2011 |

OTHER PUBLICATIONS

SIPO Office Action, issued Dec. 28, 2012, for the CN priority application 201010256175 0, which corresponds to the current U.S. Appl. No. 13/505,542.
International Search Report of PCT application PCT/CN2011/074211, dated Aug. 18, 2011 corresponding to the current US national phase U.S. Appl. No. 13/505,542.

* cited by examiner

*Primary Examiner* — Lam T Mai
(74) *Attorney, Agent, or Firm* — Shimokaji & Associates P.C.

(57) ABSTRACT

The present invention relates to the field of mobile terminal technology and describes a calibration device for a mobile terminal and an ADC module thereof, the ADC module being disposed inside a baseband chip. The calibration device includes a bandgap voltage reference inside the mobile terminal platform for generating a reference voltage; the device further includes a circuit for connecting the bandgap voltage reference, the circuit being connected with the ADC module for providing the reference voltage generated by the bandgap voltage reference to the ADC module. The present invention uses a bandgap voltage reference inside a mobile terminal platform to provide voltage to an ADC module, which, during the ADC module calibration, does not require an external reference voltage source to perform the ADC calibration, and therefore greatly reduces calibration errors and improves calibration efficiency.

20 Claims, 2 Drawing Sheets

CALIBRATION DEVICE FOR MOBILE TERMINAL AND ADC MODULE THEREOF

FIELD OF THE INVENTION

The present invention relates to the field of mobile terminal technology and more specifically, to a calibration device for a mobile terminal and an ADC module thereof.

DESCRIPTION OF THE RELATED ART

Along with the continuous development of mobile terminal technologies, users are imposing higher and higher requirements on mobile terminal functions.

In current processes of R&D and production of cell phone products, all cell phones have errors in analog-to-digital converter (ADC) sampling due to discrete parameters of the selected electronic parts. As a result, ADC calibration needs to be performed on every cell phone unit in R&D or production.

Referring to FIG. 1, an ADC calibration circuit diagram according to the prior art is shown.

BB+PMIC are a baseband chip and a power management chip. The baseband chip BB primarily runs software and is responsible for the ADC acquisition. The power management chip PMIC primarily reduces battery voltage by one half and then inputs it to the ADC module. The reference voltage for ADC modules is 2.8 V or 2.6 V, while the battery voltage can reach up to 4.2 V, which exceeds the range of reference voltage for ADC modules. If the battery voltage is reduced by one half, the highest voltage input into the ADC module will be 2.1 V, which is lower than the reference voltage for ADC modules and falls into the range of the reference voltage for ADC modules.

In FIG. 1, an external reference voltage source is applied on the input pins VBAT and GND of a cell phone unit; the voltage amplitudes of the external reference voltage source are set at 3.4 V and 4.2 V, respectively, which are sampled by BB+PMIC, respectively, to obtain corresponding digital values. Based on these two digital values, the corresponding voltage—digital value straight line can be computed for the ADC module, with which a subsequently sampled digital value of a certain point can be determined exclusively and accurately to the voltage value thereof.

From the above process, it can be seen that said calibration process must be carried out with an external reference voltage source. Moreover, time is required for the operation of the external reference voltage source. This time is a part of the production time of cell phones. The elimination of this time can increase the production rate of cell phones; at the same time, the presence of precision errors of an external reference voltage source can directly lead to errors in ADC is module calibration and affect the accuracy to identify external analog signals by the software.

Methods to provide a method of ADC calibration without external reference voltage source so as to reduce calibration errors and improve calibration efficiency is one of the research directions in the field of mobile terminal production technologies.

SUMMARY OF THE INVENTION

The object of the present invention is to provide a calibration device for an ADC module in a mobile terminal to perform ADC calibration without an external reference voltage source so as to reduce calibration errors and improve calibration efficiency.

According to one aspect of the present invention, a calibration device for an ADC module in a mobile terminal, the ADC module being disposed inside a baseband chip, wherein the calibration device further comprises a bandgap voltage reference inside a mobile terminal platform for generating a reference voltage; and the calibration device further comprises a calibration device circuit for connecting the bandgap voltage reference, the calibration device circuit being connected with the ADC module for providing the reference voltage generated by the bandgap voltage reference to the ADC module.

According to another aspect of the present invention, a mobile terminal comprises a calibration device for an ADC module; and a baseband chip containing the ADC module, wherein the calibration device further comprises a bandgap voltage reference inside the mobile terminal platform for generating a reference voltage; and the calibration device further comprises a calibration device circuit for connecting the bandgap voltage reference, the calibration device circuit being connected with the ADC module for providing the reference voltage generated by the bandgap voltage reference to the ADC module.

According to a further aspect of the present invention, a method for calibrating an analog to digital converter (ADC) of a mobile terminal comprises generating a reference voltage within a mobile terminal platform; splitting the reference voltage into a first path and a second path, the second path having a reduced voltage compared to the first path; delivering the reference voltage and the reduced voltage to a multiplexor, the multiplexor being connected to an ADC within a baseband chip of the mobile terminal; and calibrating the ADC based on the reference voltage and the reduced voltage.

Some embodiments of the present invention use a bandgap voltage reference inside the mobile terminal platform to provide voltage to the ADC module, which, during the ADC module calibration, does not require an external reference voltage source to perform the ADC calibration, and therefore greatly reduces calibration errors and improves calibration efficiency.

DETAILED DESCRIPTION OF A PREFERRED EMBODIMENT

To make the objects, technology and advantages of the present invention more clearly understood, the present invention is further described in detail below with reference to the accompanying drawings and an embodiment. It should be understood that the specific embodiment described herein is only intended to explain the present invention, not to limit the present invention.

Figure 1:
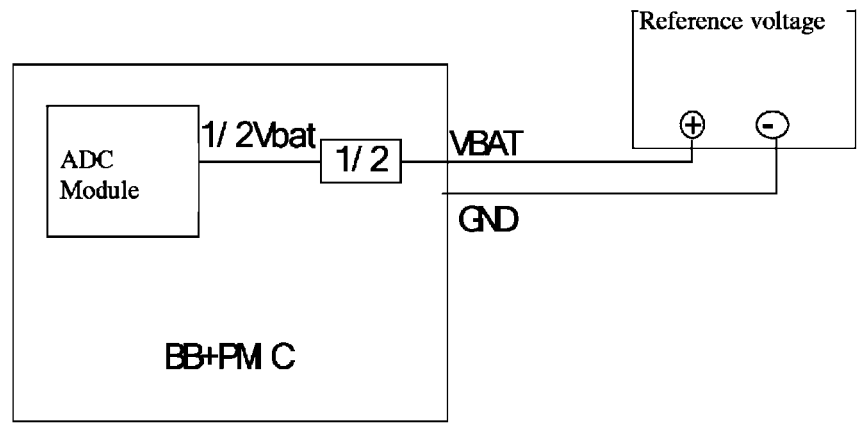
FIG. 1 shows a calibration circuit diagram for ADC module in a mobile terminal according to the prior art.
Figure 2:
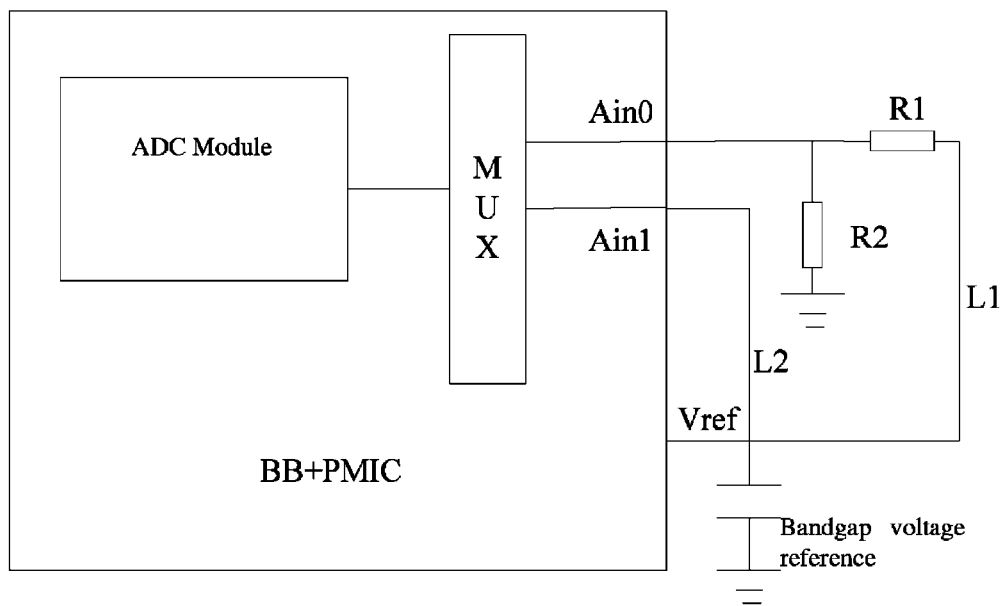
FIG. 2 illustrates the structure of a calibration device for ADC module in a mobile terminal according to an embodiment of the present invention.

FIG. 2 illustrates the structure of a calibration device for an ADC module in a mobile terminal according to an embodiment of the present invention.

The ADC module is disposed inside a baseband chip BB or a power management chip PMIC, and the calibration device further comprises a bandgap voltage reference inside a mobile terminal platform for generating a reference voltage Vref.

The device further comprises a circuit connected to the bandgap voltage reference, the circuit being connected with the ADC module to provide the reference voltage generated by the bandgap voltage reference to the ADC module.

The circuit comprises a first circuit L1 and a second circuit L2, a multiplexer switch MUX is disposed inside the baseband chip. The multiplexer switch MUX is connected with the ADC module and the first circuit L1 and the second circuit L2 are connected with the multiplexer switch.

A first input channel Ain0 and a second input channel Ain1 are disposed inside the baseband chip, the first circuit L1 is connected with the multiplexer switch via the first input channel Ain0, and the second circuit L2 is connected with the multiplexer switch MUX via the second input channel Ain1.

The first circuit L1 and the second circuit L2 are connected with the bandgap voltage reference.

In FIG. 2, Vref is a reference voltage for the mobile terminal PMIC. The voltage is generated by the bandgap voltage reference and is 1.2 V; the bandgap voltage reference inside the mobile terminal platform is very accurate and used as the reference power source for the entire power system of the mobile terminal.

The embodiment of the present invention divides Vref into two paths, a first path that directly enters the second input channel Ain1 of the ADC in the baseband chip and a second path that generates a 0.6 V voltage input via division by the resistor R1 and the resistor R2 and then inputs the 0.6 V signal into the first input channel Ain0. The resistor R1 and the resistor R2 are 100 K ohm, respectively.

In FIG. 2, MUX is a multiplexer switch. Since there is only one ADC module, it is necessary to use the multiplexer switch MUX to decide which analog input will be sampled.

Figure 3:
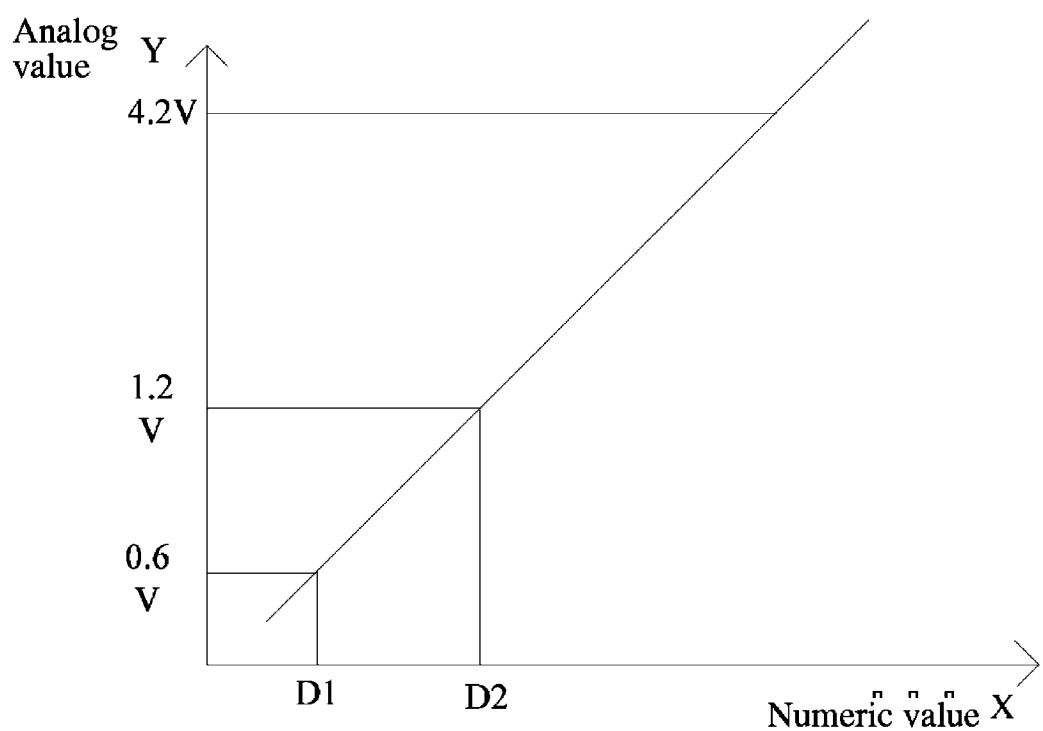
FIG. 3 illustrates the functional relationship between analog voltage and digital voltage during the ADC module calibration according to an embodiment of the present invention.

It can be seen from FIG. 2 that, by sampling the analog first input channel Ain0 and the second input channel Ain1, digital values corresponding to 1.2 V and 0.6 V can be obtained. Referring to FIG. 3, the functional relationship between analog voltage and digital voltage during the ADC module calibration is illustrated according to the embodiment of the present invention. The x axis is digital value obtained from ADC sampling, and the y axis corresponds to analog voltage value.

Assuming that the digital value obtained from ADC sampling corresponding to 0.6 V is D1 and the digital value corresponding to 1.2 V is D2, then the straight line equation in FIG. 3 is:

$$\frac{D_2 - D_1}{1.2\text{ V} - 0.6\text{ V}} = \frac{x - D_1}{y - 0.6\text{ V}}$$

$$y = \frac{0.6x}{D_2 - D_1} + 0.6 - \frac{0.6D_1}{D_2 - D_1}$$

It can be seen from $$y = \frac{0.6x}{D_2 - D_1} + 0.6 - \frac{0.6D_1}{D_2 - D_1}$$

that for any sampled digital value on the x axis, there is a corresponding analog voltage on the y axis. In this way, analog voltage and digital voltage can be converted to each other.

Another embodiment of the present invention further provides a mobile terminal where the terminal comprises the calibration device for the ADC module disposed inside the mobile terminal, which will not be described herein because of the detailed description of the device above.

An embodiment of the present invention uses a bandgap voltage reference inside the mobile terminal platform to provide voltage to the ADC module, which, during the ADC module calibration, does not require an external reference voltage source to perform the ADC calibration, and therefore greatly reduces calibration errors and improves calibration efficiency.

It should be understood that those skilled in the art may make improvements or modifications according to the above description, while all these improvements and modifications shall be encompassed by the claims of the present invention.

What is claimed is:

1. A calibration device for an ADC module in a mobile terminal, said ADC module being disposed inside a baseband chip, wherein:
    said calibration device further comprises a bandgap voltage reference inside a mobile terminal platform for generating a reference voltage; and
    said calibration device further comprises a calibration device circuit for connecting said bandgap voltage reference, said calibration device circuit being connected with said ADC module for providing the reference voltage generated by said bandgap voltage reference to said ADC module.

2. The calibration device for an ADC module in a mobile terminal as set forth in claim 1, wherein said calibration device circuit comprises:
    a first circuit and a second circuit, and
    a multiplexer switch disposed inside said baseband chip, said multiplexer switch is connected with said ADC module, and said first circuit and said second circuit are connected with said multiplexer switch.

3. The calibration device for an ADC module in a mobile terminal as set forth in claim 2, wherein:
    a first input channel and a second input channel are disposed inside said baseband chip, said first circuit is connected with said multiplexer switch via said first input channel, and said second circuit is connected with said multiplexer switch via said second input channel.

4. The calibration device for an ADC module in a mobile terminal as set forth in claim 2, wherein said first circuit and said second circuit are connected with said bandgap voltage reference.

5. A mobile terminal comprising:
    a calibration device for an ADC module; and
    a baseband chip containing said ADC module, wherein:
        said calibration device further comprises a bandgap voltage reference inside the mobile terminal platform for generating a reference voltage; and
        said calibration device further comprises a calibration device circuit for connecting said bandgap voltage reference, said calibration device circuit being connected with said ADC module for providing the reference voltage generated by said bandgap voltage reference to said ADC module.

6. The mobile terminal as set forth in claim 5, wherein said calibration device circuit comprises:
    a first circuit and a second circuit, and
    a multiplexer switch disposed inside said baseband chip, wherein said multiplexer switch is connected with said ADC module, and said first circuit and said second circuit are connected with said multiplexer switch.

7. The mobile terminal as set forth in claim 6, further comprising a first input channel and a second input channel disposed inside said baseband chip,
wherein said first circuit is connected with said multiplexer switch via said first input channel, and said second circuit is connected with said multiplexer switch via said second input channel.

8. The mobile terminal as set forth in claim 6, wherein said first circuit and said second circuit are connected with said bandgap voltage reference.

9. The calibration device as set forth in claim 2, wherein the first circuit directly connects the reference voltage to the multiplexer switch.

10. The calibration device as set forth in claim 9, wherein the second circuit includes at least one resistor to provide a reduced voltage to the multiplexer switch.

11. The calibration device as set forth in claim 10, wherein the reduced voltage is one-half of the reference voltage.

12. The mobile terminal as set forth in claim 7, wherein the first input channel is connected directly to the reference voltage and the second input channel is connected to the reference voltage through at least one resistor to provide a reduced voltage to the second input channel.

13. The mobile terminal as set forth in claim 12, wherein the reduced voltage is one-half of the reference voltage.

14. The mobile terminal as set forth in claim 5, wherein the mobile terminal is a mobile phone.

15. A method for calibrating an analog to digital converter (ADC) of a mobile terminal comprising hardware, the method comprising:
generating a reference voltage within a mobile terminal platform;
splitting the reference voltage into a first path and a second path, the second path having a reduced voltage compared to the first path;
delivering the reference voltage and the reduced voltage to a multiplexor, the multiplexor being connected to an ADC within a baseband chip of the mobile terminal; and
calibrating the ADC based on the reference voltage and the reduced voltage.

16. The method as set forth in claim 15, further comprising generating a linear calibration curve based on digital values obtained from the reference voltage and the reduced voltage.

17. The method as set forth in claim 15, wherein the reduced voltage is about one-half of the reference voltage.

18. The method as set forth in claim 15, wherein the multiplexor is disposed inside the baseband chip of the mobile terminal.

19. The method as set forth in claim 15, wherein a first circuit is connected with said multiplexor via said first path, and said second circuit is connected with said multiplexor via said second path.

20. The method as set forth in claim 19, further comprising:
connecting the first circuit directly to the reference voltage; and
connecting the second circuit to the reference voltage through at least one resistor.

* * * * *